US011670351B1

(12) United States Patent
Pallerla et al.

(10) Patent No.: US 11,670,351 B1
(45) Date of Patent: Jun. 6, 2023

(54) MEMORY WITH SINGLE-ENDED SENSING USING RESET-SET LATCH

(71) Applicant: QUALCOMM Incorporated, San Diego, CA (US)

(72) Inventors: Arun Babu Pallerla, San Diego, CA (US); Anil Chowdary Kota, San Diego, CA (US); Changho Jung, San Diego, CA (US); Chulmin Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/456,773

(22) Filed: Nov. 29, 2021

(51) Int. Cl.
  *G11C 7/10* (2006.01)
  *G11C 5/14* (2006.01)
  *G11C 7/12* (2006.01)

(52) U.S. Cl.
  CPC ............... *G11C 7/106* (2013.01); *G11C 5/14* (2013.01); *G11C 7/1063* (2013.01); *G11C 7/1087* (2013.01); *G11C 7/12* (2013.01)

(58) Field of Classification Search
  CPC ........................................................ G11C 7/10
  USPC .................................................... 365/189.05
  See application file for complete search history.

(56) References Cited

U.S. PATENT DOCUMENTS

| | | | |
|---|---|---|---|
| 6,754,746 B1 * | 6/2004 | Leung | G06F 13/40 |
| | | | 365/230.01 |
| 9,224,439 B2 * | 12/2015 | Ramaraju | G11C 8/10 |
| 11,450,359 B1 * | 9/2022 | Chen | H03K 19/018521 |
| 2008/0310246 A1 * | 12/2008 | Joshi | H03K 5/06 |
| | | | 327/172 |
| 2012/0243320 A1 * | 9/2012 | Sako | G11C 29/50004 |
| | | | 365/185.18 |
| 2014/0210516 A1 | 7/2014 | Hwang et al. | |
| 2015/0213858 A1 | 7/2015 | Tao et al. | |
| 2019/0333576 A1 | 10/2019 | Man | |

OTHER PUBLICATIONS

International Search Report and Written Opinion—PCT/US2022/049872—ISA/EPO—Feb. 8, 2023.

* cited by examiner

*Primary Examiner* — Muna A Techane
(74) *Attorney, Agent, or Firm* — Haynes and Boone, LLP

(57) ABSTRACT

Various implementations provide systems and methods for reading data from memory bit cells. An example implementation includes a read circuit that provides a single-ended output from a sensing stage. The single-ended output is received by a reset-set (RS) latch, which also receives a virtual bit line signal. The single-ended output and the virtual bit line signal provide complementary inputs to the RS latch, and the RS latch stores a sensed bit, and the sensed bit may be driven onto a data bus.

9 Claims, 8 Drawing Sheets

US 11,670,351 B1

MEMORY WITH SINGLE-ENDED SENSING USING RESET-SET LATCH

TECHNICAL FIELD

The present application relates, generally, to memory read circuits and, more specifically, to single-ended memory read circuits employing reset-set latches.

BACKGROUND

An example memory may include a multitude of memory bit cells (also called memory cells) arranged in columns, with the bit cells in a given column sharing bitlines. The bitlines may be driven by memory write circuits and read by a sense amplifier coupled to a latch. For instance, some differential read circuits may use a reset-set (RS) latch that receives as inputs a value derived from a bitline and a value derived from a complementary bitline. By contrast, some single-ended read circuits may use a clocked latch. The example single-ended read circuits do not include complementary values, such as may be derived from a bitline and a complementary bitline. Single-ended read circuits that use clocked latches may suffer from excessive dynamic power.

Accordingly, there is a need in the art for techniques for reading data from bit cells that is both compatible with a single-ended scheme as well as having lower power consumption.

SUMMARY

Various implementations provide systems and methods for reading data from memory bit cells. An example implementation includes a single-ended sensing scheme that includes a virtual complementary bitline signal. A value derived from a bitline and a value derived from the virtual complementary bitline signal may be input to a reset-set (RS) latch, where the value may be stored.

According to one implementation, a memory includes: a first bitline coupled to a bit cell; a second bitline coupled to the first bitline; a first logic gate coupled to the second bitline; and a reset-set (RS) latch having a first input and a second input, wherein the first input is coupled to the second bitline and the second input is coupled to the second bitline via the first logic gate.

According to one implementation, a method of reading data from a bit cell includes: causing a first bit line to assume a state in accordance with a digital bit that is stored in the bit cell; sensing the state, including causing a second bit line, which is coupled to the first bit line, to assume a single-ended digital value based at least in part on the digital bit; generating a virtual bit line value; receiving the single-ended digital value and the virtual bit line value at a reset-set (RS) latch; and storing the digital bit in the RS latch.

According to one implementation, a memory device includes: means for storing a bit of data; means for sensing a state of a bit line that is coupled to the means for storing the bit of data; means for generating a virtual bit line value from an output of the means for sensing; and a reset-set (RS) latch having a first input coupled to the means for sensing and a second input coupled to the means for generating the virtual bit line value.

According to one implementation, a system includes: a memory device coupled to a processor and configured to perform read operations and write operations in response to the processor; a plurality of bit cells arranged in rows and columns within the memory device; and read circuitry coupled to a first one of the bit cells, the read circuitry including: a bit line pair coupled to a first logic gate and to the first one of the bit cells; a reset-set (RS) latch having a first input coupled to an output of the first logic gate; and a second logic gate coupled to a second input of the RS latch, the second logic gate further coupled to the output of the first logic gate and to a control signal.

DETAILED DESCRIPTION

Figure 1:
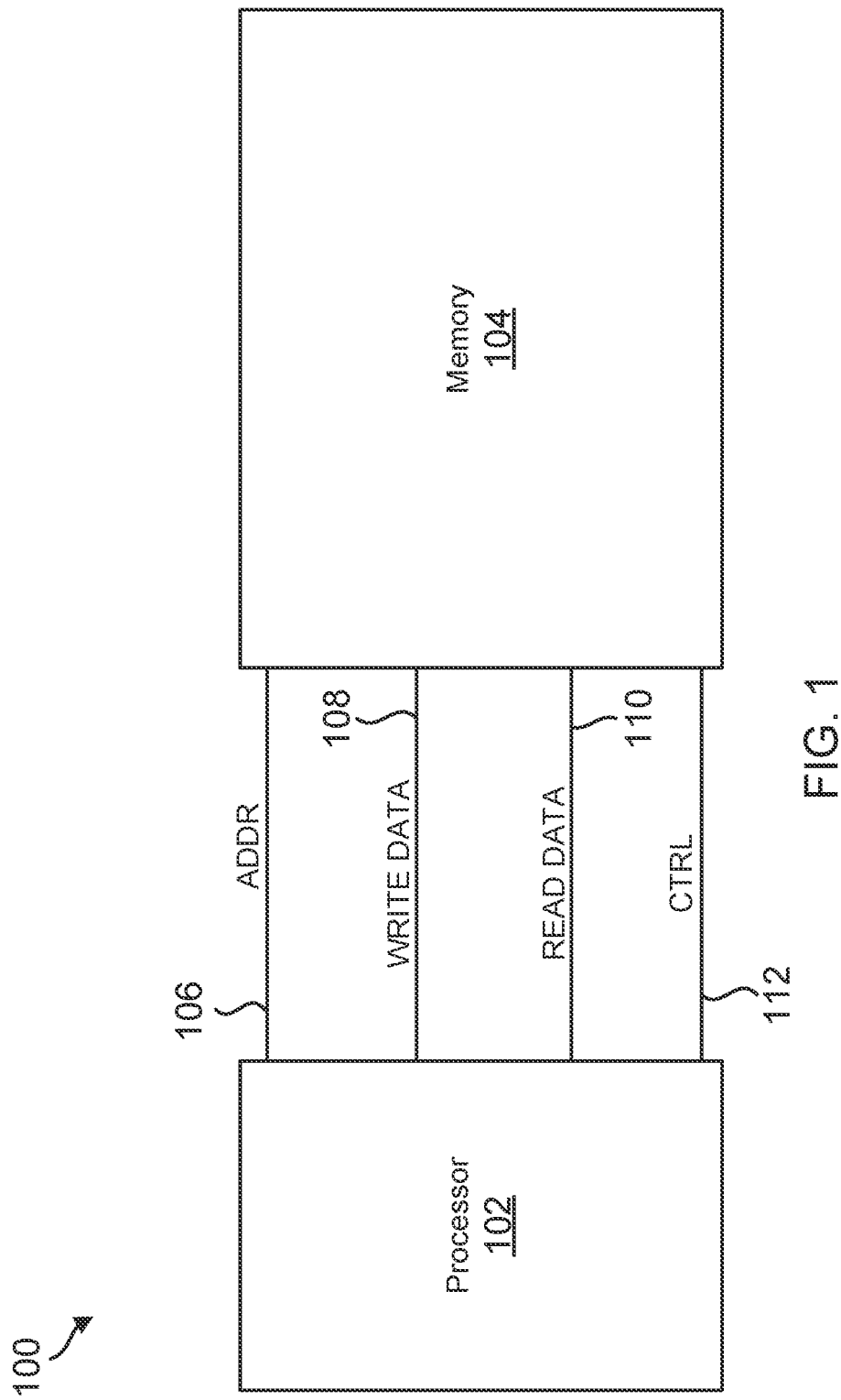
FIG. 1 is a conceptual block diagram illustrating an example of a processing system, according to one implementation.

An example implementation includes memory having a single-ended sensing architecture that employs a reset-set (RS) latch to receive and store a sensed bit of data. Looking at a given bit cell that is being read from, it includes a pair of bitlines—a bitline and a complementary bitline. One of the bitlines may be coupled to a local bitline that feeds into a global bitline at a sensing stage of the memory system.

The sensing stage may include an upper bitline and lower bitline pair that are coupled to the local bitline through, e.g., the upper bitline. A logic gate, such as a NAND gate, may receive the lower bitline and the upper bitline pair as inputs and provide output onto the global bitline. The global bitline may include one or more inverters in line with an output of the logic gate. The global bitline may take on a value that is derived from one of the bitlines of the bitline pair of the bit cell. For instance, if the local bitline is coupled to a complementary bitline of the bit cell, then the value of the global bitline may be dependent, at least in part, upon the value of the complementary bitline.

Continuing with the example, the memory system may further include a logic gate that is coupled to the second bitline, e.g., the global bitline. In one implementation, the logic gate may include a NOR gate that receives as inputs the global bitline and a control signal. For instance, the control signal may include any appropriate signal, but in some implementations may be a periodic signal that has a desirable period and duty cycle. The output of the logic gate may then be used as a virtual bitline (or bitline bar) signal that is input to the RS latch. The RS latch may include a pair of cross-coupled NOR gates. A first one of the cross-coupled NOR gates receiving as input the output of the logic gate (the virtual bitline or bitline bar signal) and an output from the second one of the cross-coupled NOR gates. The second cross-coupled NOR gate may include as its input the output of the first cross-coupled NOR gate as well as the global bitline. The output of the system may be taken from the output of the second cross-coupled NOR gate.

Various implementations may include methods as well. An example method includes sensing a value from a bit cell, where the bit cell stores a data value. The example method may include outputting from the sensing stage a single-ended value from a logic gate, such as a NAND gate. The output from the sensing stage may correspond to a global bitline that provides a value to be latched. The method may further include latching the value from the sensing stage by employing an RS latch. One example action of the method may include generating a virtual bitline (or bitline bar) signal to use as an input to the RS latch, where another input may include the value on the global bitline. The RS latch then stores the value that was sensed in the sensing stage.

High power consumption is a concern for Systems on Chip (SoCs), central processing units (CPUs), graphics processing units (GPUs), and the like. The circuits and methods discussed herein may be implemented in SoCs, CPUs, GPUs, and other circuits that include memory systems. For example, some implementations may include a multi-port memory providing two reads and one write per clock cycle (2R+1W), which may occupy large portion of a GPU (768 instances). In some traditional GPUs, the dynamic power (e.g., read and write operations) coming from the memories may be as high as 15% of total GPU power. Traditionally multi-port memories may have single-ended sensing followed by a latch controlled by local clock signals. But the single-ended sensing scheme with the clocked latch may contribute to undesirably excessive input-output (IO) read dynamic power from the local clock and control signals. By contrast, various implementations described herein may instead use single-ended sensing with an RS latch, which may be a lower-power solution than the clock-controlled latch of other systems.

Furthermore, another advantage of various implementations includes that the RS latches may be used for voltage level shifting. For instance, some implementations may include different power domains at the sensing stage versus at the latch stage. As described in further detail below, the latch stage may provide the level shifting to interface between the two power domains. Moreover, the various implementations described herein are counterintuitive because they use an RS latch with two inputs to interface with a global bitline having a single-ended value. The single-ended value is accommodated by use of the virtual bitline or bitline bar signal so that the RS latch receives two inputs.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, processor cache, flash memory, or any other suitable memory. Accordingly, all references to an SRAM are intended only to illustrate exemplary aspects of memory with the understanding that such aspects may be extended to a wide range of applications.

FIG. 1 is a conceptual block diagram illustrating an example of a processing system 100, according to one implementation. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a static random access memory (SRAM), or any other multibank component capable of retrieving and storing information. As explained in more detail with respect to FIGS. 3-4, memory 104 may include a multitude of single-ended sensing stages latched by RS latches.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes, etc. In some examples, however, the size of the data may be fixed, e.g., 8, 16, 32, 64 bytes, etc. Accordingly, the byte enable signal may be optional on the control bus 112.

The control bus 112 may include a read signal and a write signal. The read signal and the write signal may be used to generate a read enable and a write enable, respectively, within the memory 104. The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 is writing a memory location in the memory 104, the processor 102 may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. In other examples, however, a single bidirectional data bus may be used to write data from the processor 102 to the memory 104 and to read data from the memory 104 to the processor 102. An example implementation, a bit of data that is being read from memory 104 is stored in an RS latch and is then driven onto the read data bus 110 by one or more data drivers (not shown). Of course, the scope of implementations is not limited to that shown in FIG. 1. For instance, in an implementation that includes processor cache, there may be different connections between the processor 102 and the memory 104 than those shown in FIG. 1. However, the concepts discussed herein may be applied to any appropriate implementation.

Figure 2:
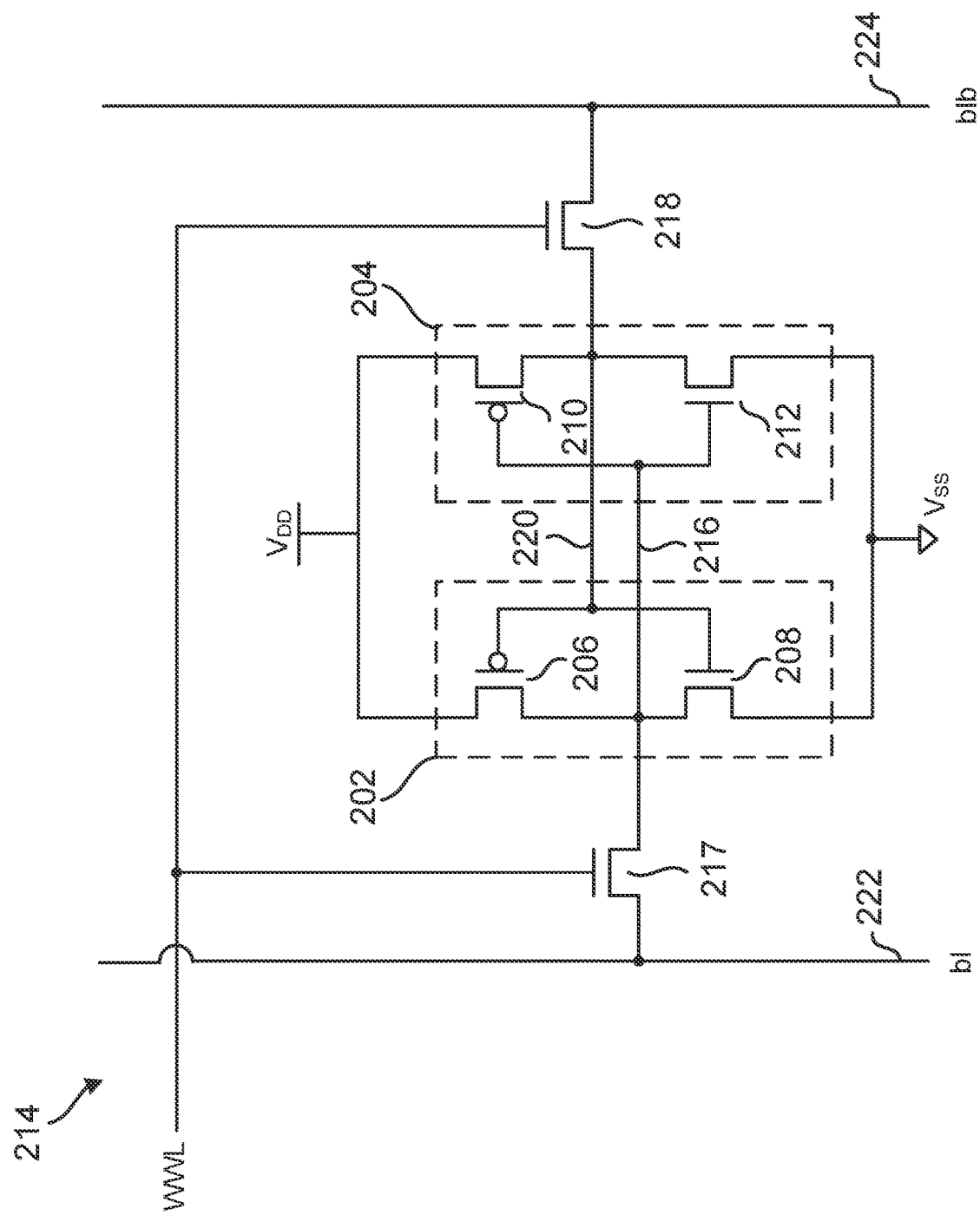
FIG. 2 is a schematic diagram of an exemplary implementation of a memory cell of a memory bank, according to one implementation.
Figure 3:
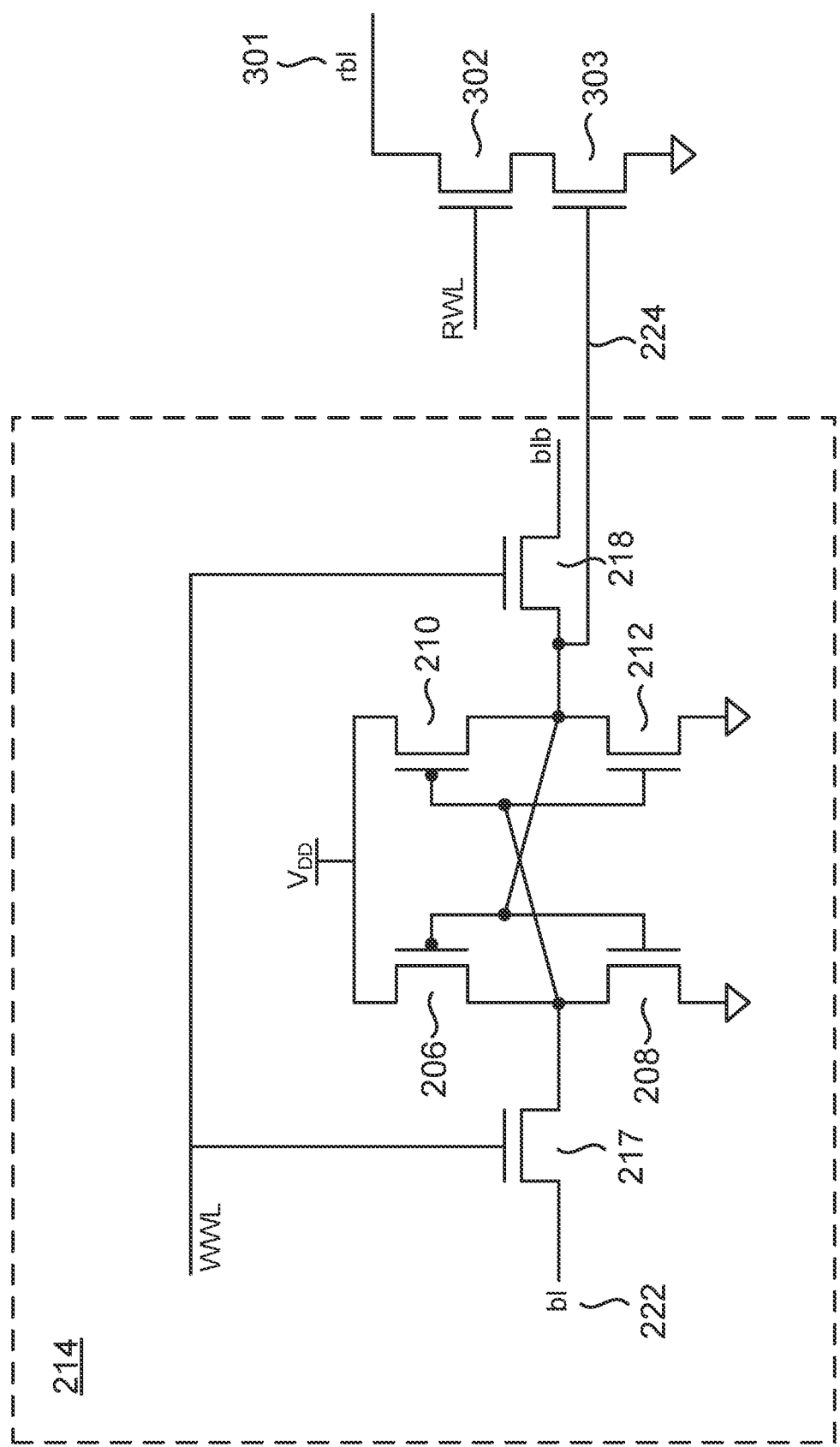
FIGS. 3-4 are an illustration of an example memory system using single-ended sensing and an RS latch, according to one implementation.
Figure 4:
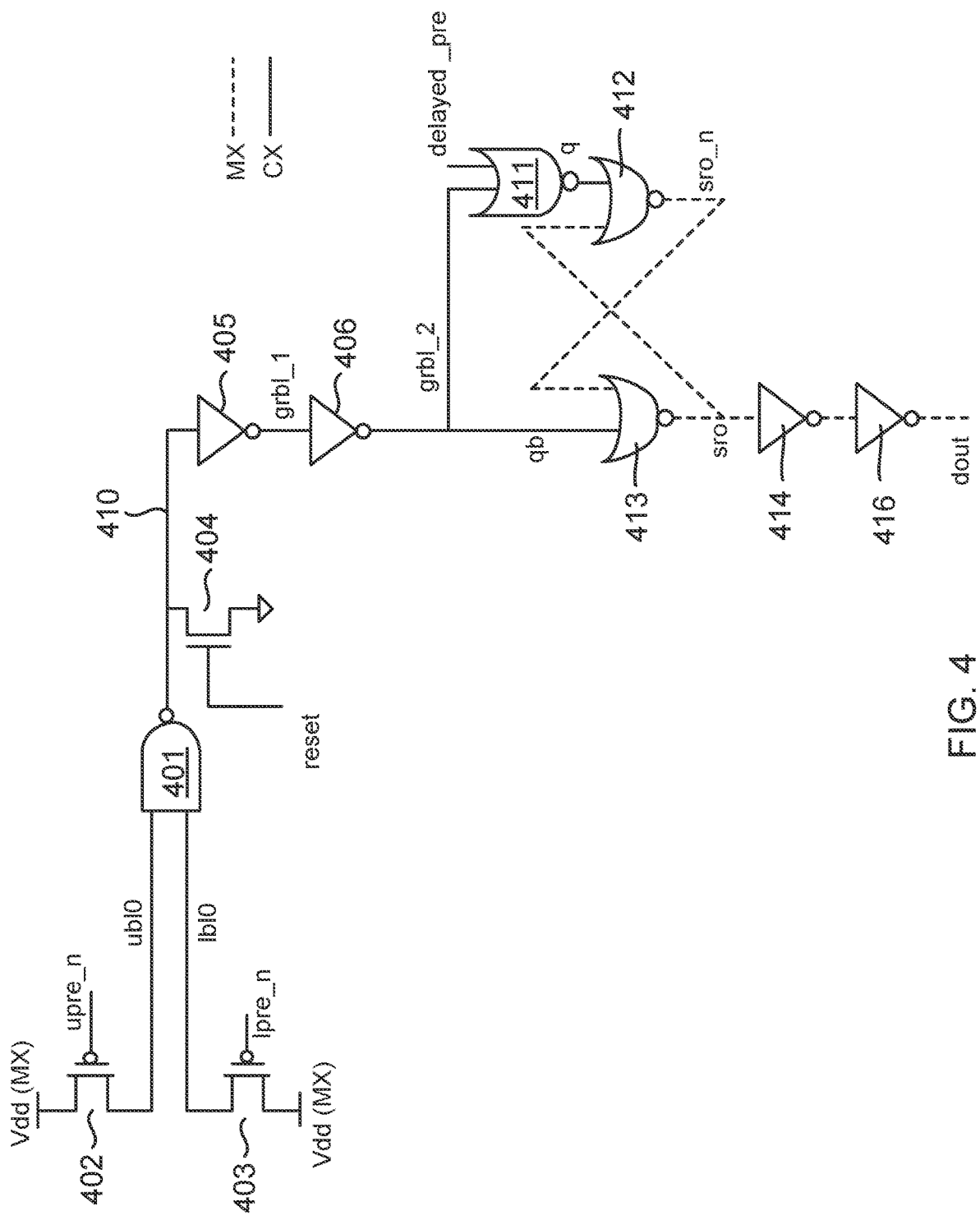

FIG. 2 is a schematic diagram of an exemplary implementation of a memory cell 214 of a memory bank. For instance, the memory 104 of FIG. 1 may include a multitude of memory banks, where each of the memory banks includes a multitude of memory cells (also called bit cells) arranged in rows and columns. FIGS. 3-4 (described in more detail below) show an example circuit for reading a bit of data from the memory cell 214 using a sensing stage and an RS latch stage. The memory cell 214 illustrated in FIG. 2 is a six-transistor (6T) configuration. However, it is understood that any appropriate architecture may be used with the memory cell 214, such as a four-transistor (4T) configuration, an eight transistor (8T) configuration, a ten transistor (10T) configuration, or the like.

The memory cell 214 is illustrated with two inverters 202, 204. The first inverter 202 includes a positive-channel metal-oxide-semiconductor field effect (PMOS) transistor 206 and a negative-channel metal-oxide-semiconductor field effect (NMOS) transistor 208. The second inverter 204 includes a PMOS transistor 210 and an NMOS transistor 212. In the described implementation, the inverters 202 and 204 are powered by VDD and have a return power rail VSS (e.g., ground). The first inverter 202 and the second inverter 204 are interconnected to form a cross-coupled latch. A first NMOS access transistor 217 couples the output node 216 from the first inverter 202 to a bitline bl, and a second NMOS transistor 218 couples the output node 220 from the second inverter 204 to a bitline blb 224 (the value of which is the opposite or inverse of the bitline bl 222). The gates of the NMOS access transistors 214, 218 are coupled to a wordline WWL.

A write operation may be performed by setting the bitlines bl 222 and blb 224 to the value to be written to the memory cell 214 and asserting the wordline WWL. The wordline WWL may be asserted before the value to be written (e.g., write data) is provided to the bitlines bl 222 and blb 224. A high value, e.g., a logic level "1" may be written to the memory cell 214 by setting the bitline bl to a logic level "0" and the bitline blb 224 to a logic level "1." The logic level "0" at the bitline bl 222 is applied to the second inverter 204 through the first NMOS transistor 214, which in turn forces the output node 220 of the second inverter 204 to VDD. The output node 220 of the second inverter 204 is applied to the input of the first inverter 202, which in turn forces the output node 216 of the first inverter 202 to VSS. A logic level "0" may be written to the memory cell 214 by inverting the values of the bitlines bl 222 and blb 224.

Once the write operation is complete, the wordline WWL is de-asserted, thereby causing the NMOS access transistors 214 and 218 to disconnect the bitlines bl 222 and blb 224 from the two inverters 202, 204. The cross-coupling between the two inverters 202, 204 maintains the state of the inverter outputs as long as power is applied to the memory cell 214.

The memory cell 214 stores data according to the data values stored at output nodes 216 and 220. If the memory cell 214 stores a logic high (i.e., a '1'), then output node 216 is at a logic high and output node 220 is at a logic low (i.e., a '0'). If the memory cell 214 stores a logic low, then output node 216 is at a logic low and output node 220 is at logic high. During a read operation, differential bitlines bl 222 and blb 224 may be pre-charged by a pre-charge circuit. The word line WWL is then asserted, thereby turning on NMOS transistors 214, 218. The timing between the pre-charging and asserting the wordline WWL may be controlled by a row decoder 204 (not shown).

If memory cell 214 stores a logic high, then bitline bl remains charged via the first NMOS access transistor 214, and complimentary bitline blb 224 is discharged via the second NMOS transistor 218. If memory cell 214 stores a logic low, then bitline bl 222 is discharged via the first NMOS transistor 214, and complimentary bitline blb 224 remains charged via the second NMOS transistor 218.

FIGS. 3 and 4 together illustrate a memory system for reading data, according to one implementation. FIG. 3 illustrates an architecture that includes memory cell 214. The complementary bitline blb 224 is coupled to a gate of NMOS transistor 303. The read word line (RWL) is coupled to a gate of NMOS transistor 302. The local bitline rbl 301 is coupled to a drain of NMOS transistor 302. Although not shown in FIG. 3, rbl 301 is coupled to the upper bitline (UBL) of FIG. 4 within the local data path (LDP) for single-ended sensing at the NAND gate 401.

The upper bitline UBL and the lower bitline LBL are pre-charged via transistors 402 and 403, respectively. For instance, when the signals upre_n and 1pre_n are low, the PMOS transistors 402, 403 are on, thereby charging the upper bitline and lower bitline to a logic one in the power domain MX. The local data path of FIG. 4 is illustrative of the various local data paths that are included in each memory bank of a multi-bank memory system. It is understood that other local data paths in other memory banks would have a similar architecture and would operate similarly to that described in FIG. 4.

The output of NAND gate 401 is provided to the global bitline 410. In other words, the local bitline rbl 301 of FIG. 3 is coupled to the global bitline 410 of FIG. 4 through the NAND gate 401, and the digital value on global bitline 410 is determined, at least in part, by the digital value on the local bitline rbl 301. Global bitline 410 may be forced to a logic level 0 by asserting the reset signal at the gate of NMOS transistor 404. The global bitline 410 includes, in this example, two inverters 405, 406 coupled in series. The signal after the first inverter 405 is referred to as grbl_1, and the signal after the second inverter 406 is referred to as grbl_2.

The signal grbl_2 is a first bitline signal, which is supplemented and complemented in this example by a virtual bitline signal q. In this example, the virtual bitline signal is used in the RS latch like a bitline signal, but it is not a bitline signal itself because it is derived from grbl_2 and delayed_pre after the single-ended sensing. The virtual bitline signal is generated by logic gate 411, which in this example is a NOR gate. NOR gate 411 receives as an input grbl_2 as well as the signal delayed_pre. The signal delayed_pre is shown in more detail in FIG. 5, and it is a control signal that may be generated by any appropriate circuitry. In this example, delayed_pre is a periodic control signal (i.e., repeating according to a period) having a duty cycle configured to produce the virtual bitline signal q that is complementary to grbl_2 during read operations.

The NOR gates 412, 413 are cross-coupled and, together, form an RS latch to temporarily store the bit that results from the single-ended sensing provided by NAND gate 401. The NOR gates 412, 413 are described in more detail with respect to FIG. 6. In short, NOR gate 412 receives as an input the virtual bitline signal q as well as the output sro of NOR gate 413. The NOR gate 413 receives as inputs grbl_2 (also called qb) and the output sro_n of the NOR gate 412. The output sro of NOR gate 413 is input to the inverters 414, 416 connected in series, which produce a data output signal dout. The data output signal dout may then be transmitted to another component, such as a processor, by a bus and one or more signal drivers (not shown). Various implementations may use other logic gates to build an RS latch. For instance, some RS latches may be made of cross-coupled NAND gates, such as by replacing NOR gates 412, 413 with NAND gates. However, a cross-coupled NAND gate RS latch may not support the VDDMX to VDDCX level shifting that is described below as an advantage of the RS latch shown in FIG. 4.

Figure 5:
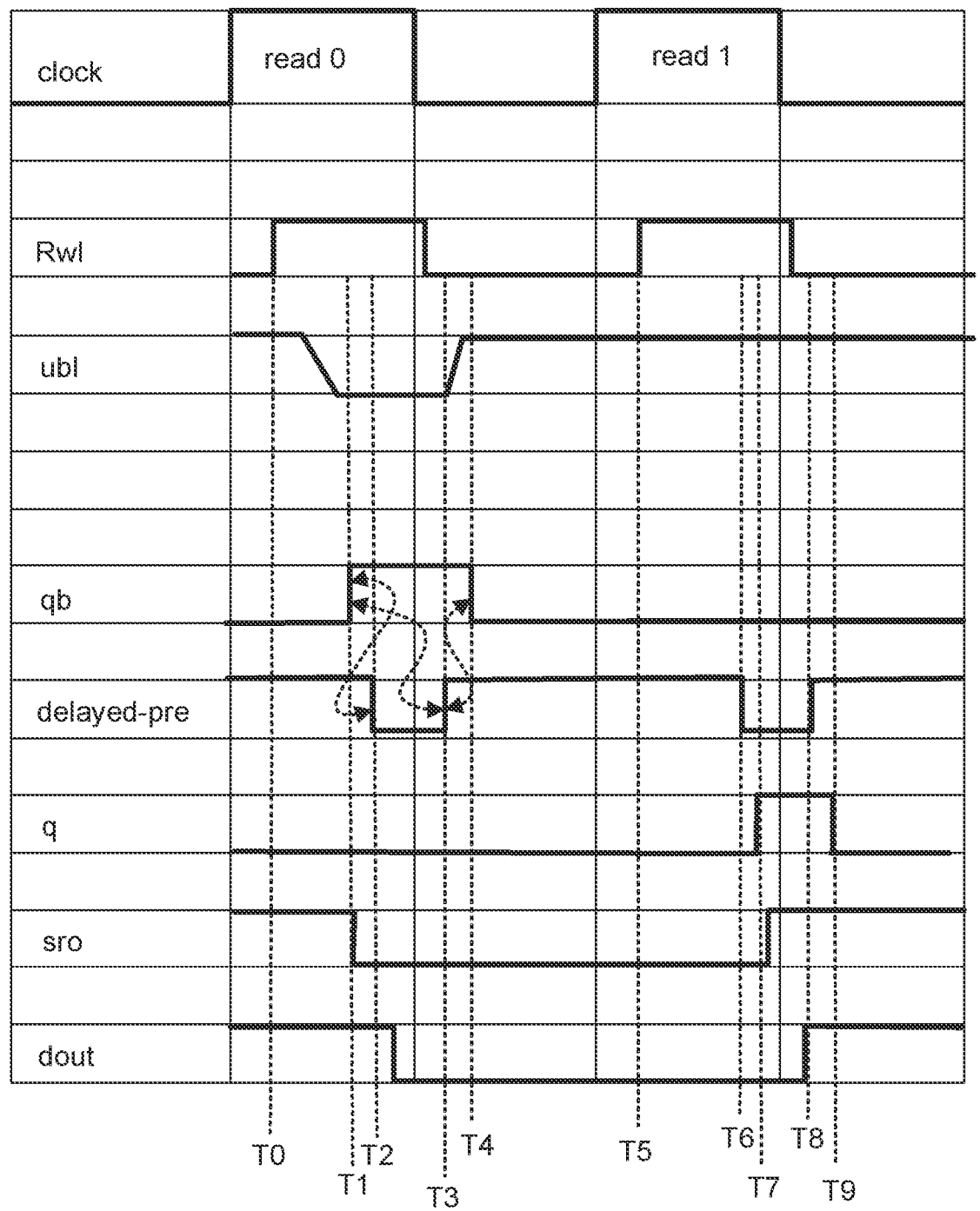
FIG. 5 is an illustration of an example timing diagram of the system of FIGS. 3-4, according to one implementation.

Examples of reading a logic zero and a logic one are now discussed with respect to FIG. 5, which shows a timing diagram according to the implementations of FIGS. 2-4. Reading a logic zero—before the read operation, the local bitline rbl and the upper and lower bitlines (ubl, lbl) are pre-charged to one. At time T0, the read word line (RWL) goes high, thereby pulling rbl to 0 as well as pulling ubl from 1 to 0, and that makes the output of the NAND gate 401 to go to logic one. This makes a logic one value at grbl_2 (qb) at time t1. The logic one value is input to the NOR gate 413, which outputs a logic zero for sro. Also, the logic one at grbl_2 disables the NOR gate 411 for virtual bitline generation, and it forces NOR gate 411 to output logic 0 at the node q at time t2. Note that delayed_pre toggles during the span of T2-T3, which is fully within the time span defined by T1-T4. The purpose is to keep the value of delayed_pre from making its way to dout.

The output sro_n of the NOR gate 412 in the latch has already gone to logic one. Now ubl is pre-charged back to logic one at times T3-T4 so that the output of the NAND gate 401 goes to logic zero, which causes grbl_2 (qb) to go back to logic zero at time T4. Now both NOR gates 412, 413 have inputs of zero, which holds the value in the latch.

Reading a logic one—once again, the bitlines are pre-charged. The read word line (RWL) goes high at time T5, and both ubl and lbl remain high. Now grbl_2 (qb) is zero. The signal delayed_pre goes to zero at time T6, so that NOR gate 411 receives both logic zeros as inputs, and that pulls the node q from 0 to 1 at time T7. The logic one at the output of NOR gate 411 is similar to a virtual bitline value of logic one. Now the output sro_n of the NOR gate 412 is logic zero, and the output sro of the NOR gate 413 is logic one. The signal delayed_pre returns to logic one at time T8, which causes the node q to go back to logic zero at time T9, and now both q and qb are at logic zero, which causes the latch to hold its value.

Figure 6:
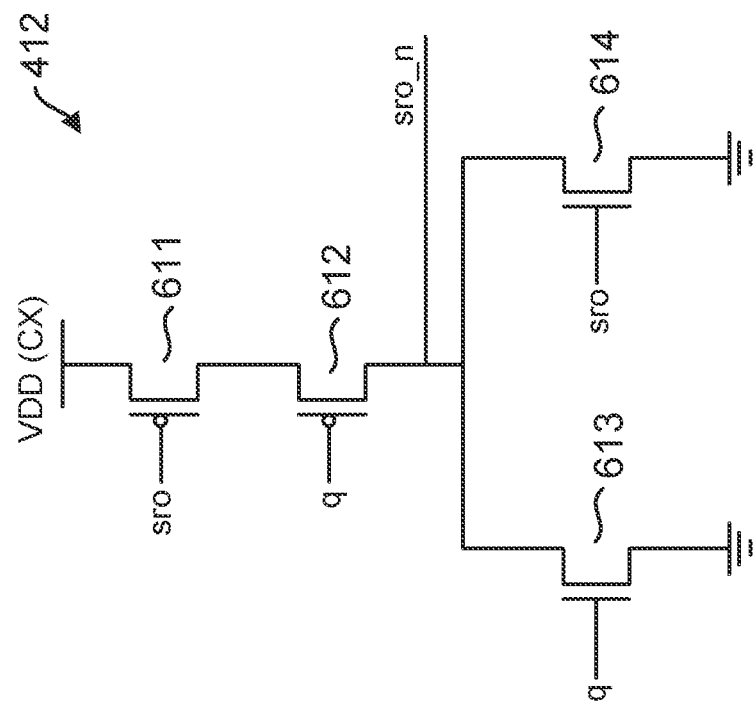
FIG. 6 is an illustration of example cross-coupled NOR gates providing voltage level shifting, according to one implementation.

FIG. 6 is an illustration of a transistor-level view of NOR gates 412, 413, according to an example implementation. Looking at NOR gate 413 first, it outputs the signal sro. Nor gate 413 includes two PMOS transistors 601, 602 as well as two NMOS transistors 603, 604. The signal grbl_2 at node qb is applied to the gates of transistors 602 and 603. The cross-coupled output from transistor 412 is applied to the gates of transistors 601, 604.

Table 1 is a truth table for the NOR gate 413:

TABLE 1

| qb (virtual bitline) | sro_n | sro |
|---|---|---|
| 0 | 0 | 1 |
| 0 | 1 | 0 |
| 1 | 0 | 0 |
| 1 | 1 | 0 |

NOR gate 412 is constructed similarly. It has two PMOS transistors 611 and 612 as well as two NMOS transistors 613, 614. The virtual bitline signal at node q is applied to the gates of transistors 612, 613, and the cross-coupled output of transistor 413 is applied to the gates of transistors 611, 614. Table 2 is a truth table for the NOR gate 412:

TABLE 2

| q (grbl 2) | sro | sro_n |
|---|---|---|
| 0 | 0 | 1 |
| 0 | 1 | 0 |
| 1 | 0 | 0 |
| 1 | 1 | 0 |

An advantageous consequence of using NOR gates 412, 413 as the RS latch is that NOR gates may provide voltage level shifting without modification. For instance, in this example, there are two power domains shown in FIG. 4—CX and MX. Further in this example, MX is lower than CX in voltage level, but the scope of implementations may include vice versa. The inputs at nodes q and qb are associated with the power domain MX, whereas the outputs sro and sro_n are associated with the power domain CX. Furthermore, the PMOS stacks of FIG. 6 (i.e., transistors 601, 602 and 611, 612) ensure that the outputs sro, sro_n are isolated from VDD when the inputs to those PMOS transistors are high, and that is true even though the power domains have different voltage levels. For instance, the outputs sro, sro_n in this example may have a higher voltage level than is seen at the nodes q, qb, and these higher voltage levels are applied to the transistors 601, 611 which are physically closest to VDD and have a gate-source voltage resulting in an off state and reducing an amount of leakage current that might otherwise occur. As noted above, other implementations may construct the RS latch from other combinations or configurations of transistors (e.g., arranging the transistors as cross-coupled NAND gates instead). However, such other transistor configurations may not support the voltage level shifting of the FIG. 6 implementation.

Figure 7:
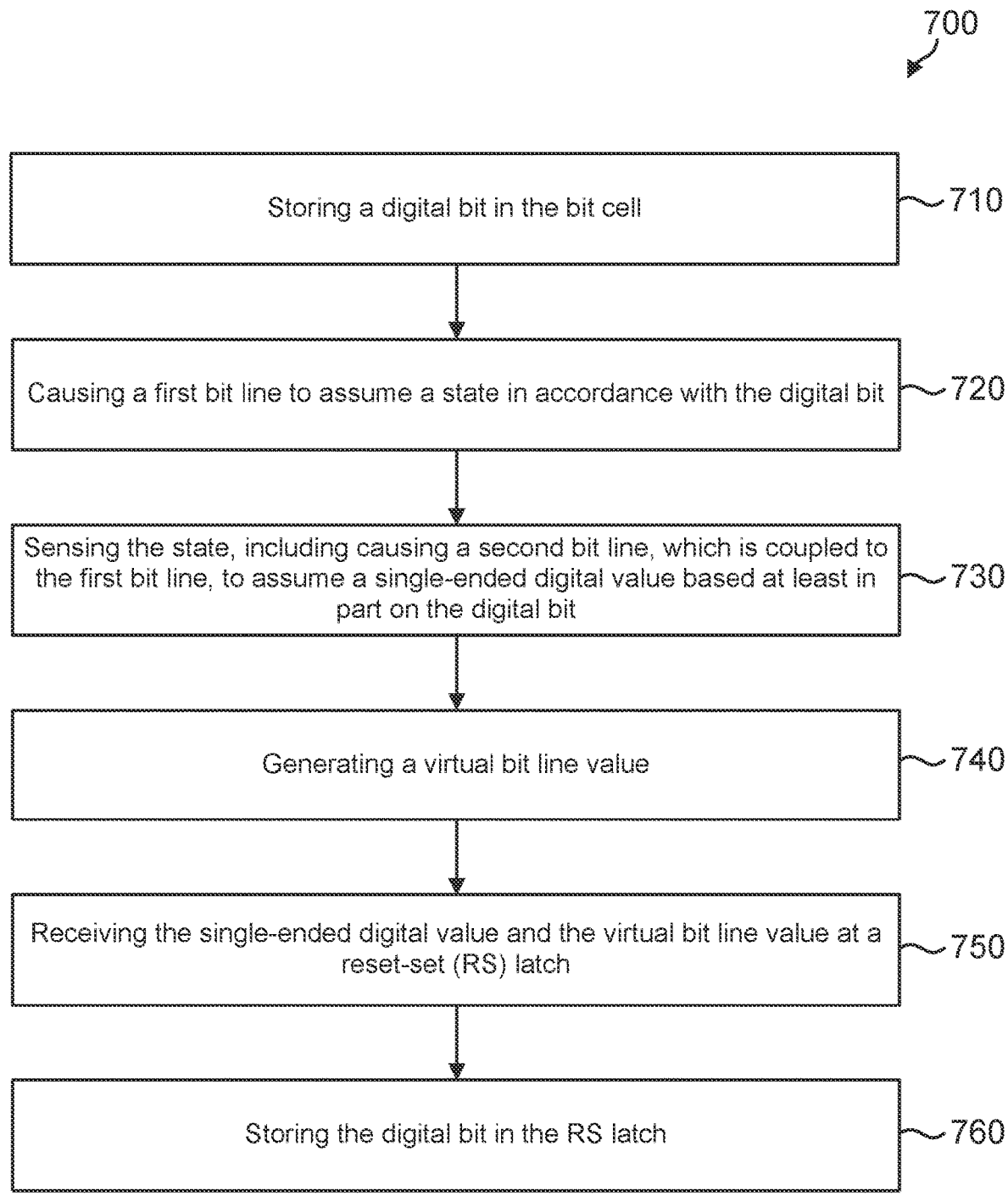
FIG. 7 is an illustration of an example method for operating a semiconductor device, such as a write driver circuit, according to one implementation.

Some implementations include methods, such as method 700 of FIG. 7. Method 700 is an example method for operating a memory system, such as described in FIGS. 1-6. While the example actions are described with respect to a reading circuit, it is understood that the reading circuit may be under control of other logic, such as a memory controller, either directly or indirectly.

At action 710, the system stores a digital bit in a bit cell. An example bit cell is shown at FIG. 2. The digital bit is stored with cross-coupled inverters, though the scope of implementations may include any appropriate bit cell. The example of FIG. 2 shows a pair of bitlines, one a bitline and one a complementary bitline. The reading is controlled by a read word line, such as RWL of FIG. 3.

At action 720, a first bitline is caused to assume a state in accordance with the digital bit. In the example of FIGS. 2-3, a logic zero stored in the bit cell 214 results in a logic one on the complementary bitline (e.g., rbl). Similarly, a logic one stored in the bit cell 214 results in a logic 0 on the complementary bitline.

At action 730, the state of the bitline (e.g., rbl) is sensed. In the example of FIGS. 3-4, the NAND gate 401 receives a pre-charged voltage lbl, and ubl takes on a voltage value associated with the voltage value of rbl. The output of the NAND gate 401 causes a second bitline (e.g., bitline 410) to assume a single-ended digital value (grbl_2) based at least in part on the digital bit. In the case of a logic zero being stored in the bit cell, that causes the second bitline to assume a value of logic one, and vice versa. In this example, the second bitline (e.g., bitline 410) is coupled to the first bitline (e.g., rbl) through the NAND gate 401.

At action 740, the method includes generating a virtual bitline value. In the example of FIG. 4, the virtual bitline is output at node q as an input to the NOR gate 412. The virtual bitline value may be produced by a logic gate, such as NOR gate 411, receiving the single-ended digital value and a periodic control signal. In the example of FIG. 5, the periodic control signal is shown as delayed_pre. The virtual bitline value in this example allows a single-ended digital value to store the digital bit from the bit cell in a multi-input latch, such as an RS latch.

At action 750, the single-ended digital value is received at an RS latch. The RS latch also receives the virtual bitline value. An example of FIG. 4, the RS latch includes cross-coupled NOR gates 412, 413. The output from the NOR gate 413 is used as the latch output, though the scope of implementations could include using the output from NOR gate 412. The RS latch has four inputs. Two of those inputs are cross-coupled outputs, and the other two inputs are the single-ended digital value (grbl_2) and the virtual bitline value.

At action 760, the digital bit is stored in the RS latch. Action 760 may include causing the single-ended digital value in the virtual bitline value to both be zero, thereby putting the RS latch in a stable state.

Action 760 may further include level shifting from one power domain to another power domain. For instance, the latch itself may operate in a power domain (CX) different from a power domain (MX) of the sensing stage. As explained above with respect to FIG. 6, cross-coupled NOR gates allow for voltage level shifting, and the architecture of FIG. 4 takes advantage of the level shifting properties to interface between the two power domains.

The scope of implementations is not limited to the specific actions shown in FIG. 7. Rather, other implementations may add, omit, rearrange, or modify one or more the actions. In one example, action 710-760 may be repeated as often as is appropriate to read data from a bank of memory cells. Furthermore, it is understood that the actions 710-760 are described with respect to a single memory bank, though the scope of implementations may include a multitude of reading circuits including same or similar actions to read data from other memory banks.

Various implementations described herein may be suitable for use in a system on chip (SoC). An example of a SoC includes a semiconductor chip having multiple processing devices within it, including a graphics processing unit (GPU), a central processing unit (CPU), a modem unit, a camera unit, and the like. In some examples, the SoC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 8:
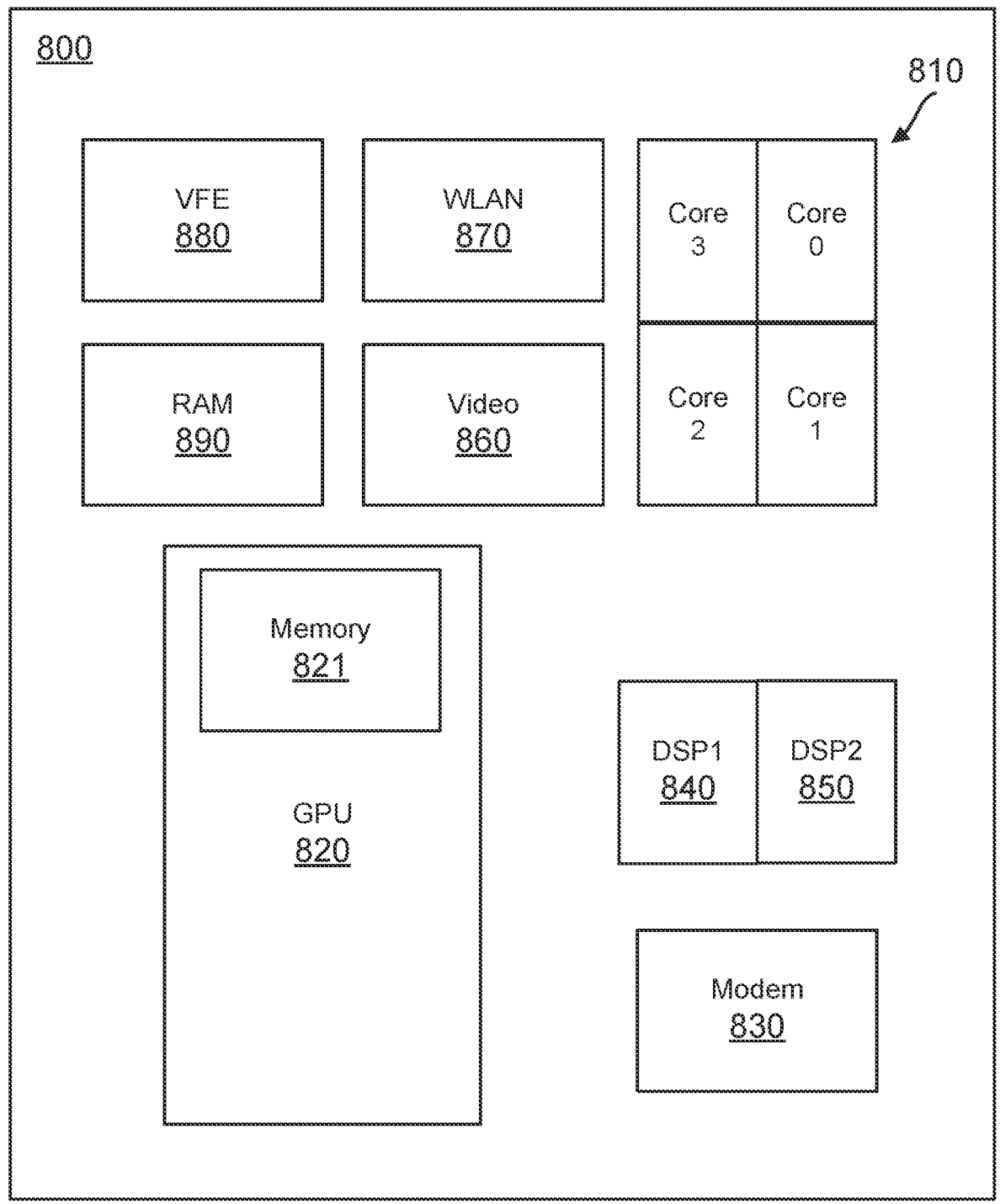
FIG. 8 is an illustration of an example system on chip (SoC) which may include a memory as in FIGS. 2-6, according to one implementation.

FIG. 8 is an illustration of example SoC 800, according to one implementation. In this example, SoC 800 is implemented on a semiconductor die, and it includes multiple system components 810-890. Specifically, in this example, SoC 800 includes CPU 810 that is a multi-core general-purpose processor having four processor cores, core 0-core 3. Of course, the scope of implementations is not limited to any particular number of cores, as other implementations may include two cores, eight cores, or any other appropriate number of cores in the CPU 810. SoC 800 further includes other system components, such as a first digital signal processor (DSP) 840, a second DSP 850, a modem 830, GPU 820, a video subsystem 860, a wireless local area network (WLAN) transceiver 870, and a video-front-end (VFE) subsystem 880. SoC 800 also includes RAM memory unit 890, which may operate as system RAM for any of the components 810-880.

RAM memory unit 890 may include reading circuits, such as those described above with respect to FIGS. 2-6. RAM memory unit 890 may receive data and instructions from any of the components 810-880 in a manner the same as or similar to that described above with respect to FIG. 1. Furthermore, RAM memory unit 890 may perform the actions of FIG. 7 to read data from memory cells in one or more memory banks.

Furthermore, in this example, GPU 820 includes memory 821. Memory 821 may be implemented as a local memory for GPU 820. In one implementation, memory 821 may be a single-bank or multi-bank memory having the architecture described above with respect to FIGS. 2-6 and performing the actions described above with respect to FIG. 7. Memory 821 may be implemented as an alternative to, or in addition to, RAM 190.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A memory comprising:
a first bitline coupled to a bit cell;
a second bitline coupled to the first bitline;
a first logic gate coupled to the second bitline; and
a reset-set (RS) latch having a first input and a second input, wherein the first input is coupled to the second bitline and the second input is coupled to the second bitline via the first logic gate.

2. The memory of clause 1, wherein the first logic gate comprises a NOR gate.

3. The memory of clause 2, wherein the first logic gate is further coupled to a periodic control signal.

4. The memory of clauses 1-3, wherein the second bitline is implemented in an upper bitline and lower bitline pair and coupled to the first input through a NAND gate.

5. The memory of clauses 1-4, wherein the RS latch comprises a second logic gate and a third logic gate, the second logic gate comprising a first p-type metal oxide semiconductor (PMOS) transistor and a second PMOS transistor arranged in series, wherein the first PMOS transistor is gate-coupled to a first control voltage associated with a first power domain and the second PMOS transistor is gate-coupled to a second control voltage associated with a second power domain.

6. The memory of clause 5, wherein the third logic gate comprises a third PMOS transistor and fourth PMOS transistor arranged in series, wherein the third PMOS transistor is gate-coupled to the first control voltage and the fourth PMOS transistor is gate-coupled to a voltage associated with the second power domain.

7. The memory of clause 5, wherein the first power domain has a lower voltage level than does the second power domain.

8. The memory of clauses 1-7, wherein the first bitline comprises a local bitline, and wherein the second bitline comprises a global bitline.

9. The memory of clauses 1-8, wherein the second bitline is associated with a first power domain, and wherein the RS latch is associated with a second power domain.

10. A method of reading data from a bit cell, the method comprising:
    causing a first bit line to assume a state in accordance with a digital bit that is stored in the bit cell;
    sensing the state, including causing a second bit line, which is coupled to the first bit line, to assume a single-ended digital value based at least in part on the digital bit;
    generating a virtual bit line value;
    receiving the single-ended digital value and the virtual bit line value at a reset-set (RS) latch; and
    storing the digital bit in the RS latch.

11. The method of clause 10, wherein generating the virtual bit line value comprises:
    receiving the single-ended digital value at a logic gate;
    receiving a periodic control signal at the logic gate; and
    outputting the virtual bit line value from the logic gate.

12. The method of clause 11, wherein the logic gate comprises a NOR gate that is coupled to an input of the RS latch, wherein the RS latch receives the single-ended digital value as an additional input.

13. The method of clauses 10-11, wherein sensing the state comprises:
    coupling the first bit line to a pre-charged third bit line, wherein the pre-charged third bit line is coupled to an input of a logic gate, and wherein a pre-charged fourth bit line is coupled to an additional input of the logic gate; and
    outputting the single-ended digital value from the logic gate.

14. The method of clause 13, wherein the logic gate comprises a NAND gate.

15. The method of clauses 10-14, wherein the virtual bit line value and the single-ended digital value corresponds to a first power domain, and wherein an output of the RS latch corresponds to a second power domain, further wherein the second power domain has a lower voltage level than the first power domain.

16. The method of clauses 10-15, further comprising:
    performing voltage level shifting between a first power domain and a second power domain at the RS latch, wherein the virtual bit line value and the single-ended digital value correspond to the first power domain, and wherein an output of the RS latch corresponds to the second power domain.

17. The method of clauses 10-16, further comprising:
    driving the digital bit from an output of the RS latch to a data bus.

18. A memory device comprising:
    means for storing a bit of data;
    means for sensing a state of a bit line that is coupled to the means for storing the bit of data;
    means for generating a virtual bit line value from an output of the means for sensing; and
    a reset-set (RS) latch having a first input coupled to the means for sensing and a second input coupled to the means for generating the virtual bit line value.

19. The memory device of clause 18, wherein the means for generating the virtual bit line value comprises a NOR gate.

20. The memory device of clause 19, wherein the NOR gate is further coupled to a periodic control signal.

21. The memory device of clauses 18-20, wherein the means for sensing comprises: an upper bitline and lower bitline pair and coupled to the RS latch through a NAND gate.

22. The memory device of clauses 18-21, wherein the RS latch comprises a first logic gate and a second logic gate, the first logic gate comprising a first p-type metal oxide semiconductor (PMOS) transistor and a second PMOS transistor arranged in series, wherein the first PMOS transistor is gate-coupled to a first control voltage associated with a first power domain and the second PMOS transistor is gate-coupled to a second control voltage associated with a second power domain.

23. The memory device of clause 22, wherein the second logic gate comprises a third PMOS transistor and fourth PMOS transistor arranged in series, wherein the third PMOS transistor is gate-coupled to the first control voltage and the fourth PMOS transistor is gate-coupled to a voltage associated with the second power domain.

24. The memory device of clause 22, wherein the first power domain has a lower voltage level than does the second power domain.

25. A system comprising:
    a memory device coupled to a processor and configured to perform read operations and write operations in response to the processor;
    a plurality of bit cells arranged in rows and columns within the memory device; and
    read circuitry coupled to a first one of the bit cells, the read circuitry including:
        a bit line pair coupled to a first logic gate and to the first one of the bit cells;
        a reset-set (RS) latch having a first input coupled to an output of the first logic gate; and
        a second logic gate coupled to a second input of the RS latch, the second logic gate further coupled to the output of the first logic gate and to a control signal.

26. The system of clause 25, wherein the processor comprises a graphics processing unit (GPU), and wherein the memory device is included within the GPU.

27. The system of clauses 25-26, wherein the bit line pair comprises a pre-charged upper bit line and lower bit line, wherein either the upper bit line or the lower bit line is coupled to a bit line bar of the first one of the bit cells.

28. The system of clauses 25-27, wherein the second logic gate comprises a NOR gate, and wherein the control signal comprises a periodic control signal.

29. The system of clauses 25-28, wherein the RS latch comprises a third logic gate and a fourth logic gate, the third logic gate comprising a first p-type metal oxide semiconductor (PMOS) transistor and a second PMOS transistor arranged in series, wherein the first PMOS transistor is gate-coupled to a first control voltage associated with a first power domain and the second PMOS transistor is gate-coupled to a second control voltage associated with a second power domain,
    wherein the fourth logic gate comprises a third PMOS transistor and fourth PMOS transistor arranged in series, wherein the third PMOS transistor is gate-coupled to the first control voltage and the fourth PMOS transistor is gate-coupled to a voltage associated with the second power domain.

30. The system of clause 29, wherein the first power domain has a lower voltage level than does the second power domain.

What is claimed is:

1. A memory comprising:
   a first bitline coupled to a bit cell;
   a second bitline coupled to the first bitline;
   a first logic gate coupled to the second bitline; and
   a reset-set (RS) latch having a first input and a second input, wherein the first input is coupled to the second bitline and the second input is coupled to the second bitline via the first logic gate.

2. The memory of claim 1, wherein the first logic gate comprises a NOR gate.

3. The memory of claim 2, wherein the first logic gate is further coupled to a periodic control signal.

4. The memory of claim 1, wherein the second bitline is implemented in an upper bitline and lower bitline pair and coupled to the first input through a NAND gate.

5. The memory of claim 1, wherein the RS latch comprises a second logic gate and a third logic gate, the second logic gate comprising a first p-type metal oxide semiconductor (PMOS) transistor and a second PMOS transistor arranged in series, wherein the first PMOS transistor is gate-coupled to a first control voltage associated with a first power domain and the second PMOS transistor is gate-coupled to a second control voltage associated with a second power domain.

6. The memory of claim 5, wherein the third logic gate comprises a third PMOS transistor and fourth PMOS transistor arranged in series, wherein the third PMOS transistor is gate-coupled to the first control voltage and the fourth PMOS transistor is gate-coupled to a voltage associated with the second power domain.

7. The memory of claim 5, wherein the first power domain has a lower voltage level than does the second power domain.

8. The memory of claim 1, wherein the first bitline comprises a local bitline, and wherein the second bitline comprises a global bitline.

9. The memory of claim 1, wherein the second bitline is associated with a first power domain, and wherein the RS latch is associated with a second power domain.

* * * * *